United States Patent [19]

Macovski

[11] Patent Number: 4,623,843
[45] Date of Patent: Nov. 18, 1986

[54] NMR IMAGING SYSTEM USING EXCITED REFERENCE COILS

[76] Inventor: Albert Macovski, 2505 Alpine Rd., Menlo Park, Calif. 94025

[21] Appl. No.: 636,733

[22] Filed: Aug. 1, 1984

[51] Int. Cl.$^4$ ........................................... G01R 33/20
[52] U.S. Cl. .................................................. 324/309
[58] Field of Search ............... 324/300, 307, 311, 313, 324/314, 318, 319, 320, 322

[56] References Cited

U.S. PATENT DOCUMENTS

| | | | |
|---|---|---|---|
| 4,417,209 | 11/1983 | Hounsfield | 324/309 |
| 4,418,316 | 11/1983 | Young | 324/309 |
| 4,425,547 | 1/1984 | Adams | 324/83 R |
| 4,442,404 | 4/1984 | Bergmann | 324/309 |

Primary Examiner—Michael J. Tokar
Attorney, Agent, or Firm—Flehr, Hohbach, Test, Albritton & Herbert

[57] ABSTRACT

NMR imaging of an object is achieved in the presence of temporal variations in the magnetic field. A reference volume is separately excited. The resultant signal is used to find the correct excitation frequency for the desired plane. Prior to receiving the signal from the object reference volumes on either side are excited to provide signals which are used to form the demodulation and sampling signals.

13 Claims, 8 Drawing Figures

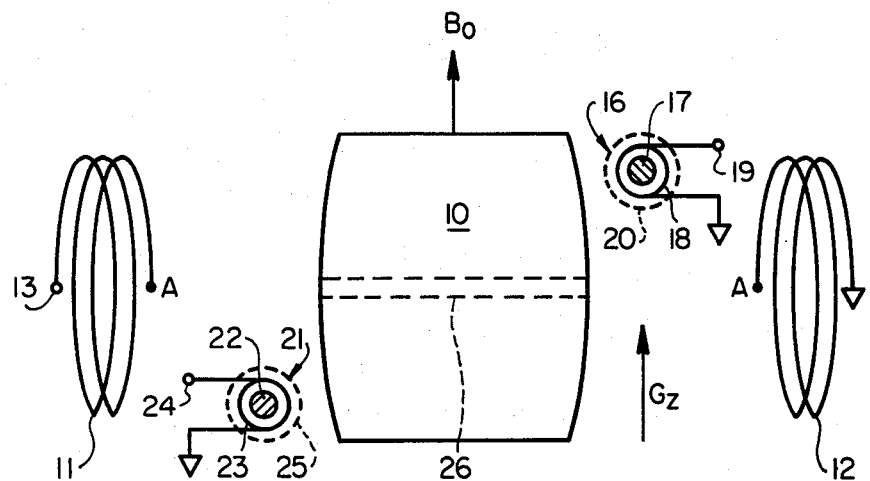
FIG_1A
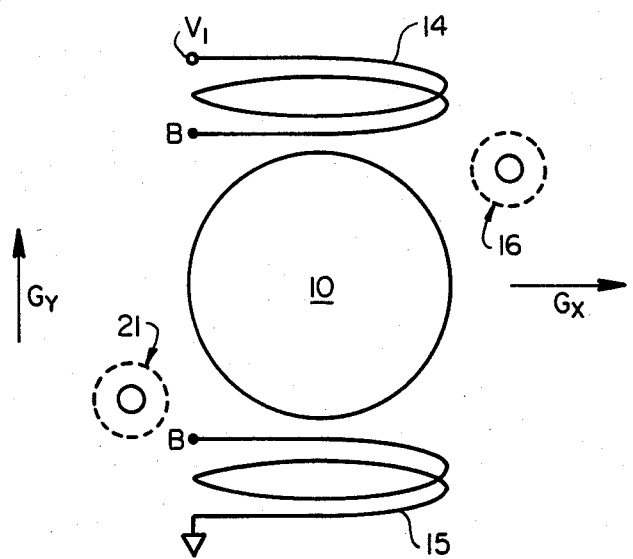
FIG_1B

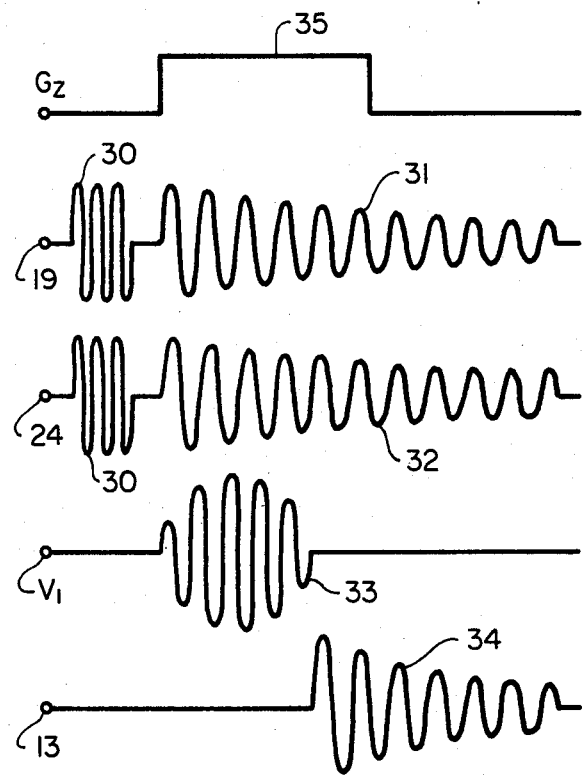
FIG_2
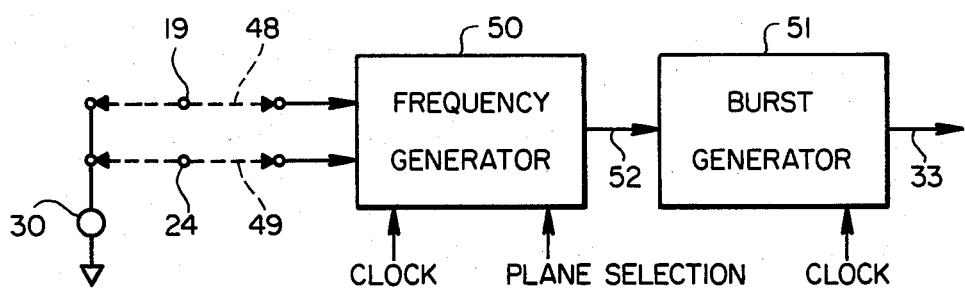
FIG_3

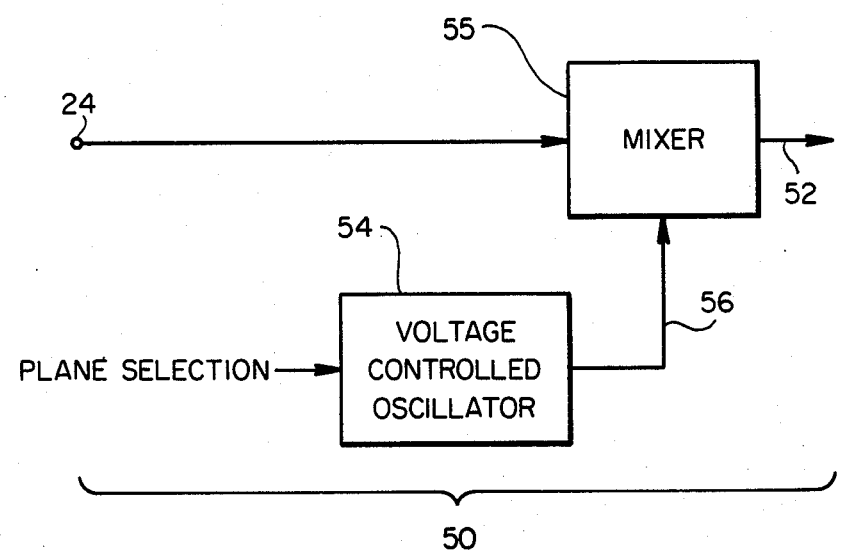
FIG_4
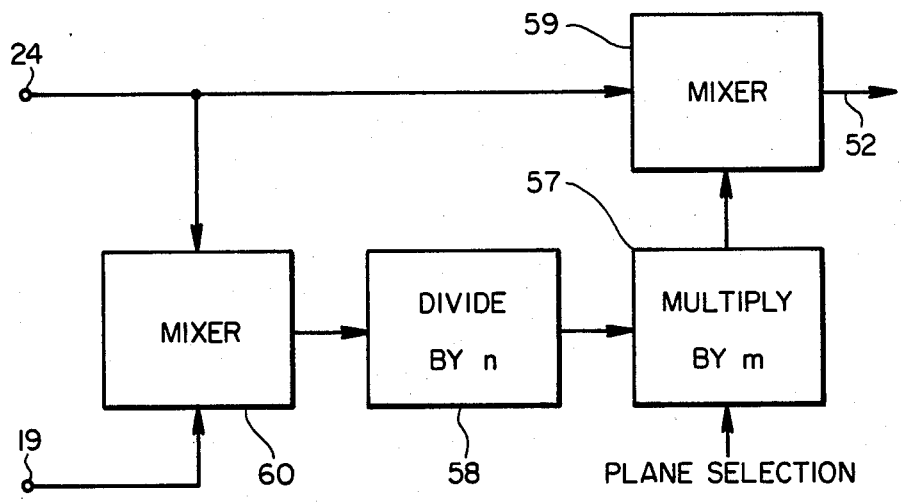
FIG_5

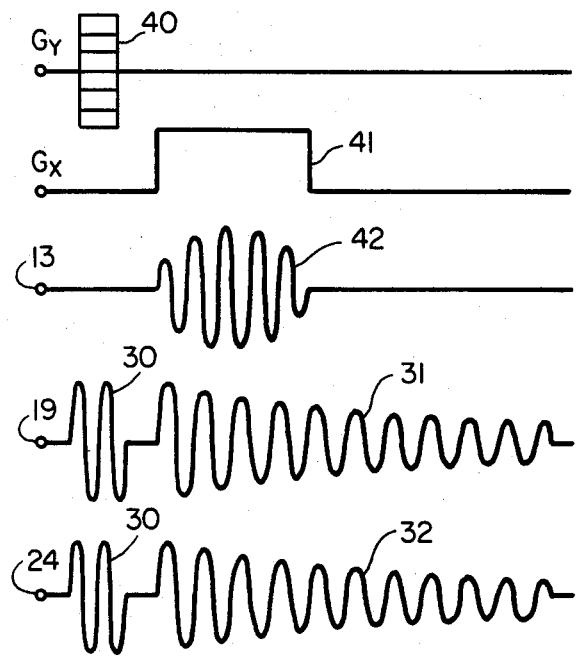
FIG_6
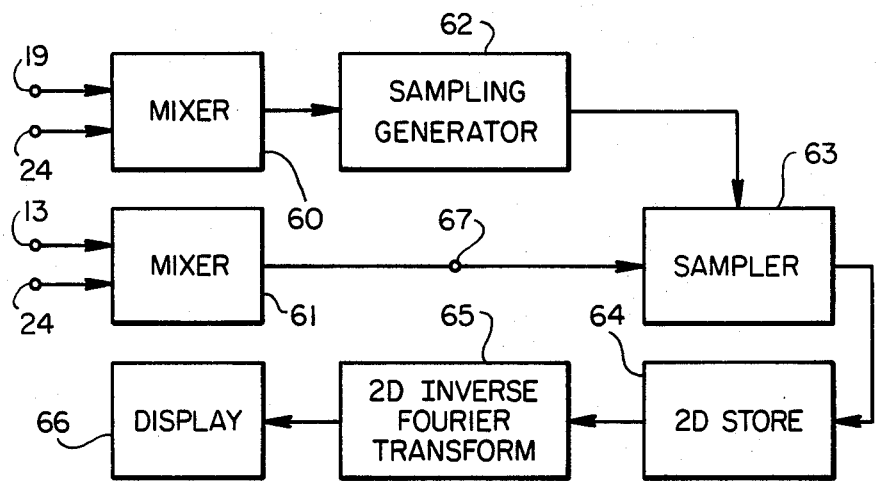
FIG_7

NMR IMAGING SYSTEM USING EXCITED REFERENCE COILS

BACKGROUND OF THE INVENTION

1. Field of the Invention

This invention relates to medical imaging systems using nuclear magnetic resonance. In a primary application the invention relates to providing NMR imaging systems which are relatively immune to variations in the magnetic fields.

2. Description of Prior Art

Nuclear magnetic resonance, abbreviated NMR, represents a new approach to medical imaging. For general descriptions of the various imaging methods we can use a number of references including the books, *NMR Imaging in Biomedicine* by P. Mansfield and P. G. Morris, Academic Press and *Nuclear Magnetic Resonance Imaging in Medicine*, published in 1981 by Igaku-Shoin, Ltd. Tokyo or review papers including "NMR Imaging Techniques and Applications: A Review," by P. A. Bottomley, Rev. Sci. Instrum., vol. 53, September 1982, pp. 1319-1337, and "Fourier Transform Nuclear Magnetic Resonance Tomographic Imaging," by Z. H. Cho, et al., Proceedings of the IEEE, vol. 70, October 1982, pp. 1152-1173. In these, various NMR imaging systems are described, each requiring a highly stable magnetic field because of the critical nature of the magnetic resonance. Subtle variations in these fields can cause either severe distortions or complete loss of the image. As a result of these severe stability requirements, most manufacturers have begun to use superconducting magnets, which are both expensive and difficult to maintain. They are also incapable of reasonably rapid field variations, which is desirable for some studies such as relaxation times as a function of frequency.

This problem of a severe stability requirement was addressed in UK Application No. GB 2076542A and U.S. Pat. No. 4,417,209 by Godfrey N. Hounsfield. In this patent small pickup coils are used to sample the received signals on either side of the object being studied. The output from these coils form the demodulating signals for the signals received from the principal receiver coil. Thus magnetic field variations during the time signals are received are compensated for.

This approach, however, does not compensate for field variations which cause errors in the transmitter or excitation signals. Also, the method shown requires complex handling of the signals when projections are taken in different directions. At least four separate pickup coils are required, preferably a pair for each projection angle, or a single pair of pickup coils which are rotated for each projection angle.

It would be highly desirable to have a self-compensating NMR imaging system which tolerated magnetic field changes. In U.S. application Ser. No. 457,589 now U.S. Pat. No. 4,521,734 by the same inventor entitled, "Pulsed Main Field Nuclear Magnetic Resonance Imaging System," an improved system of supplying the main magnetic field is described, using a pulsed electromagnet. This provides higher fields at reduced dissipation, lower cost, and flexibility of the magnetic field. It does have the disadvantage, however, of being potentially susceptible to variations in the magnetic field. A system which is self-compensating would solve this problem, and provide for a greatly improved and more flexible system.

In U.S. application Ser. No. 476,474 filed 3/18/83 a basic method was shown of compensating for magnetic field changes. A two-burst excitation scheme was used, such as inversion recovery or spin echo. The first excitation was a nonselective broadband burst, with the second excitation a selective narrow-band burst, all in the presence of a gradient field. The signal received from a reference coil around a reference volume, during the first burst, is used to estimate the frequency required for the selective burst. Thus the desired region is excited independent of drift. Similarly, during the receive mode, reference coils on either side of the object measure the frequency and bandwidth of the received signals. These signals are used to produce demodulation and sampling signals. In this approach the reference volumes are excited by the same excitation field as that of the object.

SUMMARY OF THE INVENTION

An object of this invention is to provide an NMR imaging system which is immune to temporal instabilities of the field.

A further object of this invention is to provide a simplified method of providing automatic reference signals to demodulate the received NMR signals.

A further object of this invention is to provide a method of automatically exciting the region of interest with the correct frequency.

A further object of this invention is to provide the desired reference signals with simple coil configurations.

Briefly, in accordance with the invention, reference volumes adjacent the object are separately excited using a coil surrounding the reference volume. The resultant signals in these coils are used to derive the desired object excitation frequency, corresponding to the desired region. Also, they are used to derive the object demodulation and sampling frequencies during the receiving mode.

BRIEF DESCRIPTION OF THE DRAWINGS

For a more complete disclosure of the invention, reference may be made to the following detailed description of several illustrative embodiments thereof which is given in conjunction with the accompanying drawings, of which:

FIG. 1a is a schematic drawing illustrating an embodiment of the invention;

FIG. 1b is a top view of FIG. 1a;

FIG. 2 is a set of waveforms illustrating an embodiment of the invention for exciting the desired section;

FIG. 3 is a block diagram of an embodiment of the invention for exciting the desired section;

FIG. 4 is a block diagram of an embodiment for producing the desired frequency;

FIG. 5 is a block diagram of an alternate embodiment for producing the desired frequency;

FIG. 6 is a set of waveforms illustrating an embodiment of the invention for deriving the demodulation and sampling frequencies; and FIG. 7 is a block diagram illustrating an embodiment of the invention for deriving the demodulation and sampling frequencies.

DESCRIPTION OF THE PREFERRED EMBODIMENT

An understanding of the broad aspects of the invention may best be had by reference to FIGS. 1a and 1b, where an NMR image is desired of object 10. This is often a cross-sectional image of one or more planar sections, such as section 26. Other imaging modalities include projection imaging as described in pending U.S. applications by the same inventor Ser. Nos. 332,925 and 332,926 now U.S. Pat. Nos. 4,528,985 and 4,486,708. FIG. 1 includes what has now become the standard structures of all NMR imaging. This includes a source of the main magnetic field, of the order of 1–10 kilogauss, which is shown, for convenience, as $B_0$ in the z direction. These are presently used in a variety of forms including resistive electromagnets, super-cooled magnets and permanent magnets. The resistive magnets are inexpensive and allow flexibility of the magnetic field. Unfortunately their relative instability has made their operation somewhat difficult, which is the principal subject of this application. Also, in U.S. application Ser. No. 457,589 by the same inventor entitled "Pulsed Main Field NMR Imaging System" a method is shown for supplying high magnetic fields without dissipation problems.

In general, selective imaging is accomplished using sequences of one or more gradient fields shown in FIGS. 1a and 1b $G_x$, $G_y$ and $G_z$. The nuclei in volume 10 are excited using rf coils 14 and 15 where the letters B are joined in form a series connection. These coils are driven by rf generator $V_1$. Although coils 14 and 15 could also be used to receive the resultant image signals, using appropriate switching, coils 11 and 12 are shown as providing the receiver function. These coils are shown in quadrature with the transmitter coils so as to minimize the pickup of the transmitter burst which can saturate the receiver input circuitry. These coils are connected in series, through joining the A terminals, and the resultant image signal appears on terminal 13.

In order to prevent serious errors and distortions occurring due to the drift and instability of the various fields, a set of reference structures, 16 and 21, are added on either side of object 10. These reference structures include vials of water 17 and 22 which are approximately the size of a voxel (volume picture element). These water vials are surrounded by coils 18 and 23 having terminals 19 and 24.

Unlike the prior art, for improved flexibility and a simpler geometric arrangement, these reference structures are separately excited, rather than being excited by the object excitation system including coils 14 and 15. To insure that the excitations do not interact, r.f. shields such as shields 20 and 25 are used which surround the reference coils. Although single coils 18 and 23 are shown for providing both the excitation and receive functions, these could also be a set of quadrature coils to avoid interaction. However, since these coils are used only to derive a single frequency signal, the single coil configurations should be adequate.

As shown in FIG. 2, the system is first used to excite the desired section of interest. As an example, we make a cross sectional image of section 26 in Fig. 1a. Section 26 is an xy section normal to the z axis. It should be understood that, using these same techniques, a section can be imaged normal to any of the three axes. The desired section is selected by using narrow band burst signal 33 for $V_1$ in the presence of a $G_z$ gradient 35. In that case the desired burst frequency $\omega_0$ is given by $$\omega_0 = \gamma(B_0 + G_z z_0)$$

where $\gamma$ is the gyromagnetic ratio for the substance being imaged, usually hydrogen, and $Z_0$ is the desired imaging plane. Unfortunately $B_0$ and sometimes $G_z$ can drift and result in excitation of the wrong section. This is a particular problem if this drift occurs during an imaging sequence where different excitations will be of different planes, severely distorting the image.

In the previously referenced U.S. application Ser. No. 476,474 this was accomplished in a dual-excitation system where the first non-selective excitation was used to determine the correct frequency of the second selective excitation. In this approach, using separately excited reference structures, this is not necessary. Either single or multiple excitation of the object can be used. For illustrative purposes, in FIG. 2, we show a single excitation system using burst 3.

To provide the correct frequency $\omega_0$ for burst 33, independent of drift, we first excite one or both of the reference volumes by applying bursts 30 to terminals 24 and/or 19. This is done, as shown in FIG. 3, by first connecting these coils, via switches 48 and 49, to burst generator 30. Thus both reference coils 19 and 24 are excited by burst 30. Burst 30 is a relatively broadband burst to insure the excitation of these reference coils independent of drift in the magnetic field $B_0$. Following this excitation switches 48 and 49 are connected to Frequency Generator 50 so that the resultant FID signals 31 and 32 from the reference structures can be used to provide the correct burst frequency on burst 33 for exciting section 26 in object 10.

These FID signals 31 and 32 indicate the correct frequencies corresponding to the particular z positions of the reference structures 16 and 21. For example, if reference structure 21 is at $z_1$ and 16 is at $z_2$ the frequencies produced are $$\omega_1 = \gamma(B_0 + G_z z_1)$$

and $$\omega_2 = \gamma(B_0 + G_z z_2)$$

These signals are combined in 50 to produce $\omega_0$, the frequency required for plane $z_0$. One approach is shown in FIG. 4 which use only signal 24 with FID 32. Here we make use of the relationship $$\omega_0 = \omega_1 + \gamma G_z(z_0 - z_1)$$

which is obtained by combining the previous equations. Thus knowing $\gamma$, $G_z$, $z_0$, and $z_1$, the measurement of $\omega_1$ provides the desired frequency $\omega_0$ corresponding to $z_0$, plane 26. Note, in the above equation, that it is independent of $B_0$, thus automatically compensating for the drift of $B_0$.

In its implementation in FIG. 4, a plane selection signal, in the form of a voltage, is applied to voltage controlled oscillator 54 to produce a signal 56 having a frequency $\gamma G_z(z_0 - z_1)$ where all constants are fixed except the selected $z_0$. Signal 24, FID 32, is at the frequency $\omega_1$. Signals 24 and 56 are combined in mixer 55 to produce the sum signal 52, which is the desired simple $\omega_0$ independent of $B_0$.

As shown in FIG. 3, the signal 52 is applied to burst generator 51 to shape and form burst signal 33 to excite the desired section. System clocks are connected to 50 and 51 to provide the desired timing for the start and stop of each waveform.

This general approach is very flexible in that it can be used with any type of excitation system, whether it produces an FID or a spin echo. This is because the reference structure is separately excited and can thus provide reference signals at any desired time.

In the system of FIG. 4, although it has complete immunity to $B_0$ drift, it can show some variation due to a drift in the gradient field $G_z$. This is corrected by the system of FIG. 5 where both signal 19 and 24, FID's 31 and 32, are utilized. Using the previous equations, the required $w_0$ can be calculated as $$\omega_0 = \omega_1 + \frac{z_0 - z_1}{z_2 - z_1}(\omega_2 - \omega_1)$$

where $\omega_1$ and $\omega_2$ are measured, $z_1$ and $z_2$ are known and $z_0$ is selected. Note that this result is independent of all magnetic fields, and is thus immune to drift. Frequency generator 50 can include a simple computer including counters for determining $w_1$ and $w_2$ and the appropriate subtractors, dividers and multipliers which are well known.

Alternatively the system can be implemented as shown in FIG. 5 using the equation $$\omega_0 = \omega_1 + m/n(\omega_2 - \omega_1)$$

where n discrete positions of $z_0$ can be chosen between $z_1$ and $z_2$. First the difference signal $\omega_2 - \omega_1$ is generated in mixer 60. This is then divided by n in a conventional frequency divider 58 producing a signal having a frequency $(\omega_2 - \omega_1)/n$. This is then multiplied by m in 57 where m is an integer between one and n. This signal is then added to 24 at frequency $\omega_1$ in 59 to provide 52 at frequency $\omega_0$. Thus $z_0$ is moved in n discrete steps from $z_1$ to $z_2$. The foregoing represents some representative approaches to deriving the correct excitation frequency $\omega_0$ independent of magnetic field drift.

We have thusfar concentrated on the problem of exciting the desired section in the presence of unstable, time-varying magnetic fields. We now concentrate on receiving the signals in the presence of unstable fields. In the prior art, this is accomplished in relatively awkward fashion. For example, in the previously referenced patent by Hounsfield, and in related patents including U.S. Pat. Nos. 4,418,316, and 4,425,547, the projection reconstruction systems of imaging is used involving projections taken at various angles. To stabilize this system, reference coils are used placed along the direction of the transverse gradient. These can either by mechanically rotated as the projection angle is rotated, or an array of reference coils at orthogonal angles can be used, with the outputs appropriately combined. To avoid this awkward structure application Ser. No. 476,474 introduced the concept of using the 2DFT or spin warp system of reconstruction where projections are always taken in the same direction, thus enabling the use of only two reference coils on either side of the object, in the direction of the gradient. These coils were in the center of the object and sufficiently narrow so as to always pick-up the same phase for each acquisition. Also, in all of the prior art, the reference structures were elongated so as to include signals from all excited sections normal to the $B_0$ axis.

In this invention we again use the 2DFT or spin warp systems involving projection in one direction only. However, the problem of coil placement and elongation is solved by again using the unique concept of separately exciting the reference coils as shown in FIG. 6. First, as is standard in the spin warp imaging method, following excitations of object 10, not shown, a variable integrated area gradient $G_y$ is used to create different cyclical phase distributions in the y dimension. Following this, the signal 13, such as spin echo 42, is received with the gradient $G_x$ in the x direction. This creates projections in the y direction, each having a different frequency, with each $G_y$ integral determining the spatial frequency along the projection direction. This system is presently the most widely used amongst commercial NMR imaging systems.

The output signal from the receivers coil 13 is normally demodulated by first heterodyning it down to a lower frequency, and then decomposing it into line integrals using a Fourier transform. The arry of projections at different $G_y$ integrals represent the 2D transform of the desired section. They can therefore be processed using a 2D inverse transform to provide the desired two-dimensional image.

As indicated, signal 13 is first mixed in mixer 61 to bring it down to a lower, more convenient frequency. An alternate approach, not shown, is to bring it down to baseband using sine and cosine synchronous demodulators which provide the real and imaginary parts of the signal which are individually sampled. In the embodiment shown in FIG. 7, the frequency of signal 24 is such as to bring the central frequency low enough so that the band edge comes close to zero frequency. Signal 67 therefore extends from approximately zero frequency to the maximum bandwidth. This is sampled in 63 at a rate satisfying the sampling theorem, greater than twice the highest frequency. The resultant samples are stored in 64 in a 2D format representing the spatial frequencies in each dimension. The 2D array is inverse Fourier transformed in 65, with the desired cross-sectional image displayed in 66.

The foregoing description is that of the basic spin warp system. However, as previously pointed out, significant errors can occur due to the drift of magnetic fields. Here, reference signals 19 and 24, corresponding to FID signals 31 and 32, are used to process signal 13 independent of variation in the magnetic field. Note that, unlike the prior art, the reference structures 16 and 21 needn't be in the same plane as that of the cross section 26 since the reference structures are separately excited. However, since 16 and 21 receive the same lateral gradient field $G_x$ as the object signal 13, they will produce corresponding frequencies. Therefore signals 31 and 32 represent the frequency range of the desired signals, since they are on either side of the object. Therefore the difference between the frequencies of 31 and 32 represents the bandwidth of the object signal with 32 representing the lower frequency edge and 31 the higher frequency edge. Most important, these reference signals track the object signal 13 with varying magnetic fields.

For demodulation or translation to a baseband signal the signal can be heterodyned down to a low frequency signal as shown using mixer 61 in FIG. 7 where the resultant signal 67 has the object signal frequency now going from near zero to its highest frequency as represented by $\gamma G_x W$ where W is the width of the object in the x direction. Alternatively, sine and cosine demodulators, not shown, can be used with each driven by the center frequency. This center frequency can be derived as the arithmetic mean of the frequencies of signals 31 and 32.

The resultant low frequency signal 67 is sampled at least at twice the highest frequency. The highest frequency or bandwidth is derived by mixing signals 19 and 24 in mixer 60 to derive their difference frequency. This difference can, for example, be multiplied by an appropriate integer, greater than two, in sampling generator 62. The derived sampling signal then samples signal 67 in sampler 63. Most important, if $B_0$ or $G_x$ vary during the signal receiving interval, the demodulation signals and sampling rate will vary accordingly to fully compensate for the variations.

One of the more important characteristics of this invention, as compared to the prior art, is that the reference signals can be made to occur at any desired time, since the reference structures are separately excited. The signal times are therefore not limited by the excitation times of the object, but can be chosen based on being available to generate the required processing signals at the appropriate time. The duration of these signals is based on the $T_2$ spin-spin relaxation time of the water in the reference structure. This can be doped to provide the desired time duration.

In the description thusfar an image was obtained of an x-y section at a particular value of z. Clearly, using the same general approach, a section can be obtained along any of the three axes. If reference structures 16 and 21 are placed at the corners of a cube which encloses the object 10, the system is symmetrical and can be used along any axis. Thus if water vial 17 is at $x=a$, $y=a$, and $z=a$, and water vial 22 at $x=-a$, $y=-a$, and $z=-a$, a section can be taken along any axis.

Although a particular excitation and reception system has been shown, any of a wide variety of imaging sequences can be used where the reference signals are used to select the excitation region and/or demodulate and sample the received signal in the presence of an unstable magnetic field. In each instance the reference coil is separately excited to provide the reference signal at the desired time without, as in the prior art, being constrained by the object excitation system.

What is claimed is:

1. In a method for deriving NMR measurements of an object in the presence of a temporally unstable magnetic field the steps of:
    exciting nuclear spins in at least one volume outside the object using an rf excitation signal from a coil surrounding the reference volume;
    receiving a signal from excited spins in the reference volume; and
    processing the received signal to form object processing adjustment signals to use in conjunction with object measurements whereby temporal changes in the measurements will correspond to changes in the object processing adjustment signals.

2. The method as described in claim 1 where the step of processing the received signals includes the step of using the frequency of the received signal to generate the required frequency of the rf excitation signal, one of the required object processing signals.

3. The method as described in claim 1 where the step of processing the received signals includes a demodulation process and the step of combining signals taken from reference volumes on either side of the object and forming processing adjustment signals used in the demodulation process.

4. Apparatus for deriving NMR measurements of an object in the presence of a temporally unstable magnetic field comprising:
    means for applying a static magnetic field surrounding the object;
    means for applying gradient fields to the object;
    at least one reference volume positioned outside of the object and within the static magnetic field and gradient fields;
    means for exciting the reference volume with an excitation signal without exciting the object using a coil encircling the reference volume;
    means for receiving a signal from the reference volume; and
    means for processing the signal to form object processing adjustment signals to use in conjunction with object measurements whereby temporal changes in the measurements will correspond to temporal changes in the processing adjustment signals.

5. Apparatus as described in claim 4 including gradient means to enable excitation of a desired region of the object where the means for processing includes means for generating an object excitation signal having an excitation frequency corresponding to the desired region including means for deriving the excitation frequency from the frequency of the received signal from the reference volume.

6. Apparatus as described in claim 5 where a single reference volume is used and where the means for deriving the excitation frequency from the frequency of the received signal includes means for adding a frequency corresponding to the known distance between the reference volume and the desired region.

7. Apparatus as described in claim 5 where two reference volumes are used and where the means for deriving the excitation frequency from the two frequencies of the received signals includes means for combining the two frequencies which represent known positions to derive the frequency corresponding to the desired region.

8. Apparatus as described in claim 4 including gradient means for decomposing an excited region of the object where the processing means includes means for generating demodulation signals for demodulating the signals received from the excited region of the object.

9. Apparatus as described in claim 4 including gradient means for decomposing an excited region of the object where the processing means include means for generating sampling signals for demodulating the signals received from the excited region of the object.

10. Apparatus as described in claim 4 where the means for exciting the reference volume without exciting the object includes means for shielding the coil encircling the reference volume.

11. Apparatus as described in claim 7 where the processing means includes means for generating demodulation signals for demodulating the signals received from the excited region of the object and where the two reference volumes are on opposite sides of the excited region of the object and the signals received from the reference volumes are used during the receiving mode for generating demodulating signals for demodulating the signals received from the excited region of the object.

12. Apparatus as described in claim 7 where two reference volumes are on opposite sides of the excited region of the object and the signals received from these same reference volumes are used during the receiving mode for generating sampling signals for sampling the signals received from the excited region of the object.

13. Apparatus as described in claim 2 where the two reference volumes are positioned substantially on opposite corners of a cube containing the object whereby a plane can be excited along any of the three axes.

* * * * *